(12) United States Patent
Saito

(10) Patent No.: US 7,963,638 B2
(45) Date of Patent: Jun. 21, 2011

(54) METHOD OF MANUFACTURING LIQUID JET HEAD, A METHOD OF MANUFACTURING A PIEZOELECTRIC ELEMENT AND A LIQUID JET APPARATUS

(75) Inventor: Takeshi Saito, Matsumoto (JP)

(73) Assignee: Seiko Epson Corporation, Shinjuku-ku, Tokyo (JP)

( * ) Notice: Subject to any disclaimer, the term of this patent is extended or adjusted under 35 U.S.C. 154(b) by 102 days.

(21) Appl. No.: 12/408,520

(22) Filed: Jun. 12, 2009

(65) Prior Publication Data
US 2009/0244201 A1   Oct. 1, 2009

(51) Int. Cl.
*B41J 2/045* (2006.01)
(52) U.S. Cl. .................................. 347/68; 29/25.35
(58) Field of Classification Search ............ 347/68, 347/69, 70–72; 400/124.14, 124.16–124.17; 310/324, 327, 328, 363–366; 29/25.35
See application file for complete search history.

(56) References Cited

U.S. PATENT DOCUMENTS

| 7,479,728 | B2* | 1/2009 | Murai et al. | 310/363 |
| 7,725,996 | B2* | 6/2010 | Li et al. | 29/25.35 |
| 2004/0104981 | A1* | 6/2004 | Fujii et al. | 347/71 |
| 2008/0055369 | A1* | 3/2008 | Saito | 347/70 |

FOREIGN PATENT DOCUMENTS

JP   3517876 B2   2/2004

* cited by examiner

*Primary Examiner* — K. Feggins
(74) *Attorney, Agent, or Firm* — Kilpatrick Townsend & Stockton LLP

(57) ABSTRACT

In a method of manufacturing a piezoelectric element which includes a first electrode, a piezoelectric layer including a plurality of piezoelectric films, and a second electrode formed opposite a surface of the piezoelectric layer, a step of forming the first electrode metal layer includes forming the first electrode metal layer so as to include one or more iridium layer and permit the iridium layer to have the total thickness in the range from 2 to 5 nm to form the first electrode metal layer; and forming the first electrode film by heating the piezoelectric film at a temperature in the range from 400 to 650° C. for 30 minutes or more after the first piezoelectric film is formed in the step of forming the piezoelectric layer to oxidize the iridium contained in the first electrode metal layer.

4 Claims, 9 Drawing Sheets

(a)

(b)

METHOD OF MANUFACTURING LIQUID JET HEAD, A METHOD OF MANUFACTURING A PIEZOELECTRIC ELEMENT AND A LIQUID JET APPARATUS

CROSS REFERENCE TO RELATED APPLICATIONS

The entire disclosure of Japanese Patent Application No. 2008-74719, filed Mar. 21, 2008 is incorporated by reference herein.

BACKGROUND OF THE INVENTION

1. Field of the Invention

The present invention relates to a method of manufacturing a liquid jet head, a method of manufacturing a piezoelectric element, and a liquid jet apparatus.

2. Description of Related Art

As a piezoelectric element used for a liquid jet head, there is disclosed a piezoelectric element formed by forming a lower electrode film which contains an iridium layer formed of iridium (Ir) and forming a piezoelectric layer on the lower electrode film by heat treatment in Japanese Patent No. 3517876.

This piezoelectric layer is formed so as to have a predetermined thickness by repeatedly forming piezoelectric films plural times to laminate the piezoelectric films. In addition, the lower electrode film is heated simultaneously in a heating process performed when piezoelectric precursor films of the piezoelectric films are crystallized, and thus a part of the iridium of the lower electrode film is heated to turn into iridium oxide ($IrO_2$). This iridium oxide serves as preventing characteristic deterioration in a ferroelectric thin film by preventing oxygen of the ferroelectric thin film from leaking. On the other hand, since stress is focused on the lower electrode film and the piezoelectric layer, a problem occurs in that crack occurs.

These problems may occur not only in the piezoelectric element used for the liquid jet head but also a piezoelectric element used for other apparatuses.

SUMMARY OF THE INVENTION

The invention is devised in order to solve at least some of the above-mentioned problems and can be embodied as the following aspects or applied examples.

According to an aspect of the invention, there is provided a liquid jet head manufacturing method including: preparing a first board which is provided with pressure generating chambers individually communicating with nozzle openings for ejecting a liquid; and forming a piezoelectric element which includes a first electrode film formed on an area opposed to each of the pressure generating chambers of the first board, a piezoelectric layer, and a second electrode film formed on a surface of the piezoelectric layer opposite to the first electrode. The step of forming the piezoelectric element includes forming a first electrode metal layer containing iridium on the first board, forming the piezoelectric layer having a plurality of piezoelectric films by performing a step of forming a piezoelectric precursor film on the first electrode metal layer and subjecting the piezoelectric precursor film to heat treatment to form the piezoelectric film plural times, and forming the second electrode film on the piezoelectric layer. In addition, the step of forming the first electrode metal layer includes forming the first electrode metal layer so as to contain one or more iridium layer and permit the iridium layer to have the total thickness in the range from 2 to 5 nm and forming the first electrode film by performing heating at a temperature in the range from 400 to 650° C. for 30 minutes or more after a first piezoelectric film is formed in the step of forming the piezoelectric layer to oxidize the iridium contained in the first electrode metal layer.

The features other than the above aspects and objects of the invention are apparent from the description of the specification with reference to the accompanying drawings.

BRIEF DESCRIPTION OF THE DRAWINGS

In order to fully understand the invention and the advantages of the invention, the following description and the accompanying drawings will be together referred.

DESCRIPTION OF THE PREFERRED EMBODIMENTS

Figure 1:
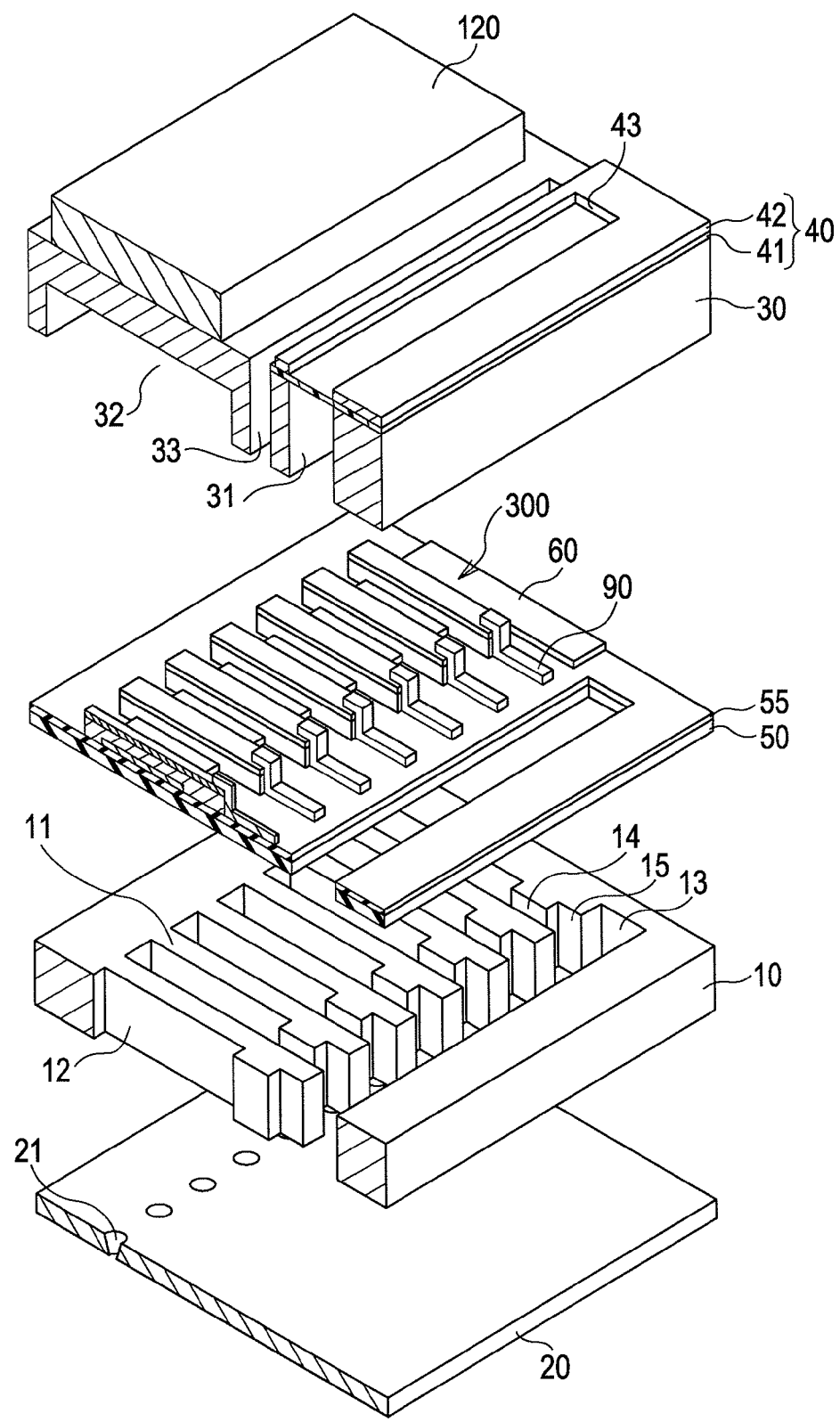
FIG. 1 is an exploded perspective view illustrating the general configuration of a printing head according to a first embodiment.

At least the following aspects are apparent from the description of the specification and the description of the accompanying drawings.

According to an aspect of the invention, there is provided a liquid jet head manufacturing method including: preparing a first board which is provided with pressure generating chambers individually communicating with nozzle openings for ejecting a liquid; and forming a piezoelectric element which includes a first electrode film formed on an area opposed to each of the pressure generating chambers of the first board, a piezoelectric layer, and a second electrode film formed on a surface of the piezoelectric layer opposite to the first electrode. The step of forming the piezoelectric element includes forming a first electrode metal layer containing iridium on the first board, forming the piezoelectric layer having a plurality of piezoelectric films by performing a step of forming a piezoelectric precursor film on the first electrode metal layer and subjecting the piezoelectric precursor film to heat treatment to form the piezoelectric film plural times, and forming the second electrode film on the piezoelectric layer. In addition, the step of forming the first electrode metal layer includes forming the first electrode metal layer so as to contain one or more iridium layer and permit the iridium layer to have the total thickness in the range from 2 to 5 nm and forming the first electrode film by performing heating at a temperature in the range from 400 to 650° C. for 30 minutes or more after a first piezoelectric film is formed in the step of forming the piezoelectric layer to oxidize the iridium contained in the first electrode metal layer.

According to this aspect, by performing predetermined heating after the step of forming the first piezoelectric film in the step of forming the piezoelectric layer, it is possible to substantially turn all the iridium contained in the first electrode metal layer into the iridium oxide. In this way, stress can be prevented from occurring inside the first electrode film or in an interface between the first electrode film and the piezoelectric layer. Moreover, crack can be prevented from occurring in the first electrode film or the piezoelectric layer. By forming the iridium layer so as to have a predetermined thickness, the iridium layer is expanded only in the thickness direction in oxidization of the iridium layer without expansion in an in-plane transverse direction. Accordingly, the stress can be further prevented from occurring inside the first electrode film or in the interface between the first electrode film and the piezoelectric layer. Moreover, the crack can be further prevented from occurring in the first electrode film or the piezoelectric layer.

According to another aspect of the invention, in the method of manufacturing the liquid jet head, it is preferable that the step of forming the first electrode film by oxidizing the iridium which is performed after the step of forming the first piezoelectric film and before the step of forming a second piezoelectric film. In this method, even when lead or the like flows out from the piezoelectric film, the lead or the like can be prevented from diffusing up to the board due to the iridium oxide. Accordingly, it is possible to manufacture the piezoelectric element improved in durability.

According to still another aspect of the invention, there is provided a method of manufacturing a piezoelectric element including a first electrode film, a piezoelectric layer, and a second electrode film formed on a surface of the piezoelectric layer opposite to the first electrode. The method includes: forming a first electrode metal layer containing iridium on a board; forming the piezoelectric layer having a plurality of piezoelectric films by performing a step of forming a piezoelectric precursor film on the first electrode metal layer and subjecting the piezoelectric precursor film to heat treatment to form the piezoelectric film plural times; and forming the second electrode film on the piezoelectric layer. The step of forming the first electrode metal layer includes forming the first electrode metal layer so as to contain one or more iridium layer and permit the iridium layer to have the total thickness in the range from 2 to 5 nm and forming the first electrode film by performing heating at a temperature in the range from 400 to 650° C. for 30 minutes or more after a first piezoelectric film is formed in the step of forming the piezoelectric layer and by oxidizing the iridium contained in the first electrode metal layer.

According to this aspect, by performing predetermined heating, it is possible to substantially turn all the iridium contained in the first electrode metal layer into the iridium oxide. In this way, stress can be prevented from occurring inside the first electrode or in an interface between the first electrode and the piezoelectric layer. Moreover, crack can be prevented from occurring in the first electrode or the piezoelectric layer. By forming the iridium layer so as to have a predetermined thickness, the iridium layer is expanded only in the thickness direction in oxidization of the iridium layer without expansion in an in-plane transverse direction. Accordingly, the stress can be further prevented from occurring inside the first electrode film or in the interface between the first electrode film and the piezoelectric layer. Moreover, the crack can be further prevented from occurring in the first electrode film or the piezoelectric layer.

According to still another aspect of the invention, there is provided a liquid jet apparatus including the liquid jet head manufactured by the above-described method.

According to this aspect, since the liquid jet head including the piezoelectric element having no crack is provided, it is possible to provide the liquid jet apparatus having high reliability.

Hereinafter, exemplary embodiments of the invention will be described with reference to the drawings. The embodiment described below is just described as an example of the invention and all constituent elements described below are not essential constituent elements of the invention.

Preferred Embodiment

Hereinafter, an embodiment will be described with reference to the drawings.

Hereinafter, the embodiment of the invention will be described in detail.

Figure 2:
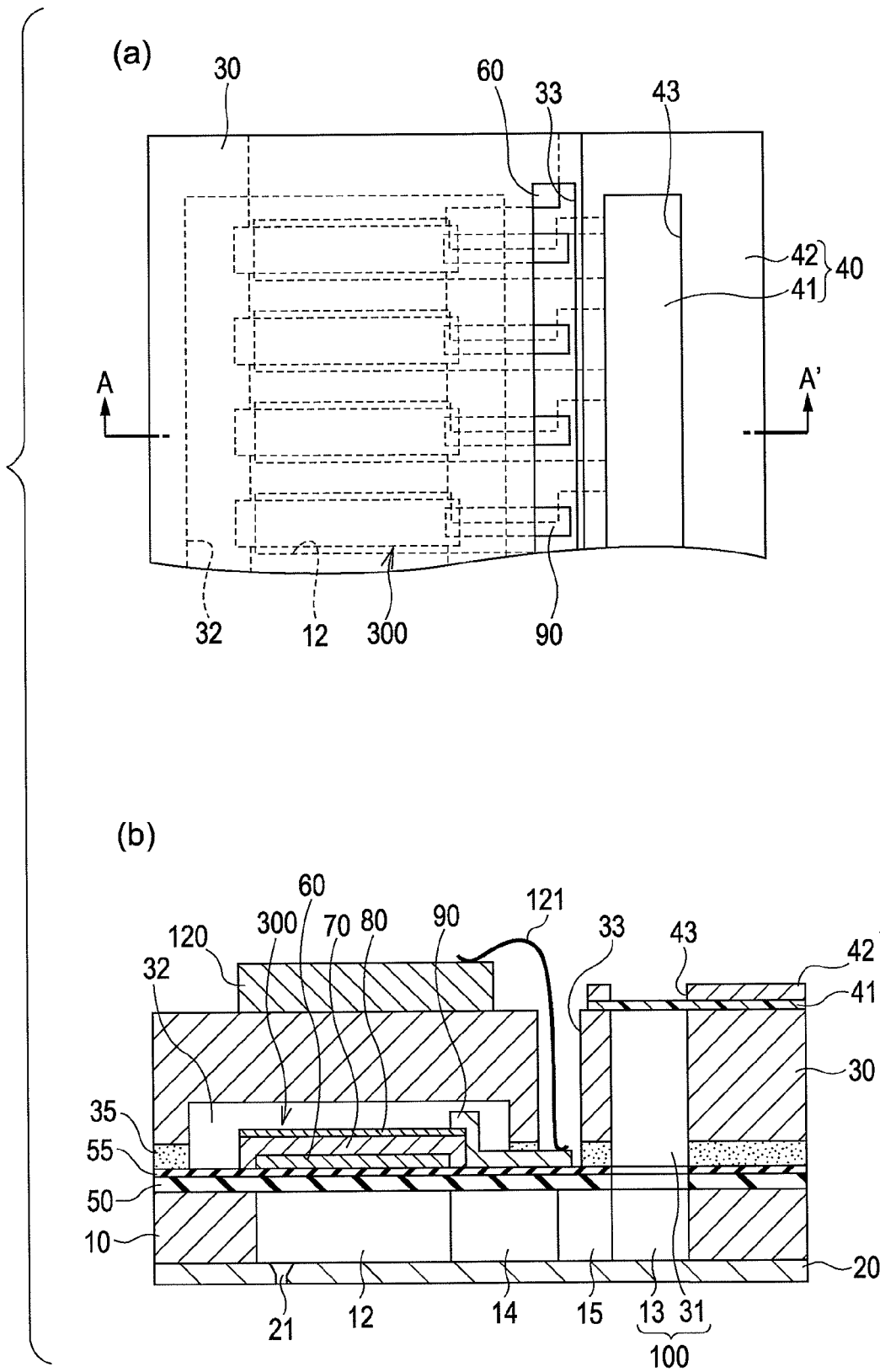
FIG. 2 is a plan view and a sectional view illustrating the printing head according to the first embodiment.

FIG. 1 is an exploded perspective view illustrating the general configuration of an ink jet printing head which is an example of a liquid jet head manufactured by a manufacturing method according to a first embodiment of the invention. (a) of FIG. 2 is a plan view illustrating major constituent elements of the ink jet printing head and (b) of FIG. 2 is a sectional view taken along the line A-A' of (a) of FIG. 2.

As illustrated, a flow passage forming board 10 is formed of a silicon single crystal substrate (a first board) having a crystal plane direction (110). An elastic film 50 formed of an oxide film is formed on one surface of the flow passage forming board. In the flow passage forming board 10, a plurality of pressure generating chambers 12 which are partitioned by a plurality of partition walls 11 by performing anisotropic etching from the other surface are arranged in parallel in the width direction (a transverse direction). Ink supply passages 14 and communication passages 15 are partitioned by the partition walls 11 in one end in a longitudinal direction of the pressure generating chambers 12 of the flow passage forming board 10. A communication section 13 forming a part of a reservoir 100 which is a common ink chamber of the pressure generating chambers 12 is formed in one ends of the communication passages 15.

A nozzle plate 20 having nozzle openings 21 punched therethrough and individually communicating with the vicinities of the ends of the pressure generating chambers 12 opposite the ink supply passages 14 is fixed and adhered to an opening surface of the flow passage forming board 10 by an adhesive, a heat welding film, or the like. The nozzle plate 20 is formed of glass ceramics, a silicon single crystal substrate, stainless steel, or the like.

On the other hand, the elastic film 50 formed of an oxide film is formed on the side opposite the opening surface of the flow passage forming board 10, as described above. An insulating film 55 formed of an oxide film having a material different from that of the elastic film 50, such as fluorite type oxide, is laminated on the elastic film 50. Piezoelectric elements 300 which each includes the lower electrode 60 as a first electrode containing iridium oxide ($IrO_2$), a piezoelectric layer 70 containing lead zirconate titanate (PZT), for example, and an upper electrode film 80 (a second electrode) formed on the piezoelectric layer 70 opposed to the lower electrode 60 and formed of iridium are formed on the insulating film 55. Here, the piezoelectric layer 70 refers to a piezoelectric layer which contains lead zirconate titanate (PZT) and an alignment control layer, even when the alignment control layer having piezoelectricity such as lead titanate between the lower electrode film 60 and the lead zirconate titanate (PZT) layer and controlling alignment of the lead zirconate titanate (PZT) layer is formed.

Here, one electrode of a pair of electrodes included in the piezoelectric element 300 serves as a common electrode which is common to the plurality of piezoelectric elements 300 and the other electrode thereof serves as an individual electrode of the respective piezoelectric elements 300. In this embodiment, for example, the lower electrode film 60 servers as the common electrode of the piezoelectric elements 300 and the upper electrode film 80 independently serves as the individual electrode of the respective piezoelectric elements 300. Of course, a reverse configuration is possible in accordance with a driving circuit or a wiring configuration. In this embodiment, the elastic film 50, the insulating film 55, and the lower electrode film 60 serve as a vibration plate. Of course, the invention is not limited thereto. For example, only the lower electrode film 60 may serve as the vibration plate without providing the elastic film 50 and the insulating film 55. Alternatively, the piezoelectric elements 300 may also serve as an actual vibration plate. A lead electrode 90 which is drawn from the vicinity of the end of the ink supply passage 14 and extends up to the insulating film 55 and which is formed of gold (Au), for example, is connected to each of the upper electrode film 80 serving as the individual electrode of the piezoelectric element 300.

Here, the lower electrode film 60 is formed by a manufacturing method described in detail below. The lower electrode film contains platinum and iridium oxide in this embodiment. The lower electrode film 60 may contain iridium oxide, may contain another conductive material instead of platinum, or may additionally contain a conductive material other than platinum.

As for the piezoelectric layer 70, lead zirconate titanate (PZT) is appropriately used as the material of the piezoelectric layer 70, but the material is not particularly limited as long as displacement is sufficiently obtained in actual use. Other ferroelectric-piezoelectric materials or relaxor ferroelectric formed by adding metal such as niobium, nickel, magnesium, bismuth, or yttrium to a ferroelectric-piezoelectric material may be used. Other compositions such as $PbTiO_3$ (PT), $PbZrO_3$ (PZ), $Pb(ZrxTi1-x)O_3$ (PZT), $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), $Pb(Ni_{1/3}Nb_{2/3})O_3$—$PbTiO_3$ (PNN-PT), $Pb(In_{1/2}Nb_{1/2})O_3$—$PbTiO_3$ (PIN-PT), $Pb(Sc_{1/2}Ta_{1/2})O_3$—$PbTiO_3$ (PST-PT), $Pb(Sc_{1/2}Nb_{1/2})O_3$—$PbTiO_3$ (PSN-PT), $BiScO_3$—$PbTiO_3$ (BS-PT), $BiYbO_3$—$PbTiO_3$ (BY-PT) can be used.

The upper electrode film 80 is formed of platinum (Pt) or iridium (Ir), or a metal material formed by laminating and alloying platinum and iridium. Of course, the upper electrode film 80 may be formed of a conductive material other than the above materials.

On the flow passage forming board 10 in which the piezoelectric elements 300 are formed, a protective board 30 including a piezoelectric element preserver 32 which has a space ensuring that the movement of the piezoelectric elements 300 is interrupted is jointed to an area opposed to the piezoelectric elements 300 by an adhesive 35. The piezoelectric element preserver 32 may just have the space ensuring that the movement of the piezoelectric elements 300 is not interrupted. The space may be sealed in an airtight manner or may not be sealed. The protective board 30 which is the second board is joined to the first board. Here, "joining" is not limited to a state where the boards are directly joined to each other, but may be a state where the boards may be joined with a thin layer interposed between the first and second boards.

In the protective board 30, a reservoir section 31 is formed in an area opposed to the communication section 13. The reservoir section 31 communicates with the communication section 13 of the flow passage forming board 10, as described above, to form the reservoir 100 which is the common ink chamber of the pressure generating chambers 12. A through-hole 33 perforated through the protective board 30 in the thickness direction is formed in an area between the piezoelectric element preserver 32 and the reservoir section 31 of the protective board 30. In addition, a part of the lower electrode film 60 and front end portions of the lead electrodes 90 are exposed to the inside of the through-hole 33. A reservoir section 31 may be configured as the reservoir by dividing the communication section 13 of the flow passage forming board 10 into a plurality of portions in accordance with the pressure generating chambers 12. That is, only the pressure generating chambers 12 and the ink supply passages 14 may be formed in the flow passage forming board 10.

It is preferable that the protective board 30 is formed of material such as glass and a ceramic material having the substantially same thermal expansibility as that of the flow passage forming board 10. For example, a silicon single crystal substrate which is the same material as that of the flow passage forming board 10 is appropriately used.

A driving circuit 120 for driving the piezoelectric elements 300 is mounted on the protective board 30. For example, a circuit board or a semiconductor integrated circuit (IC) can be used as the driving circuit 120. In addition, the driving circuit 120 and the lead electrodes 90 are electrically connected to each other through connection wires 121 formed of a conductive wire such as a bonding wire.

A compliance board 40 including a sealing film 41 and a fixing plate 42 is joined onto the protective board 30. The sealing film 41 is formed of a material having a low rigidity and a flexibility. One surface of the reservoir section 31 is sealed by the sealing film 41. The fixing plate 42 is formed of a material such as metal having a hard property. Since an area opposed to the reservoir 100 of the fixing plate 42 is configured as an opening 43 completely removed in the thickness direction, one surface of the reservoir 100 is sealed only by the sealing film 41 having a flexible property.

In the ink jet printing head according to this embodiment, ink is supplied from external ink supply means (not shown), the inside from the reservoir 100 to the nozzle openings 21 is filled with the ink, and ink droplets are ejected from the nozzle openings 21 by inputting a drive signal from the upper electrode film 80 to the piezoelectric elements 300 corresponding to the pressure generating chambers 12 in accordance with a print signal supplied from the driving circuit 120, deforming the elastic film 50, the insulating film 55, the lower electrode film 60, and the piezoelectric layer 70 so as to be bent, and increasing the pressure of the respective pressure generating chambers 12.

Hereinafter, a method of manufacturing the ink jet printing head will be described with reference to FIGS. 3 to 8. FIGS. 3 to 7 are sectional views illustrating the pressure generating chamber 12 in the longitudinal direction. FIG. 8 is a sectional view illustrating major portions of a lower electrode metal layer.

Figure 3:
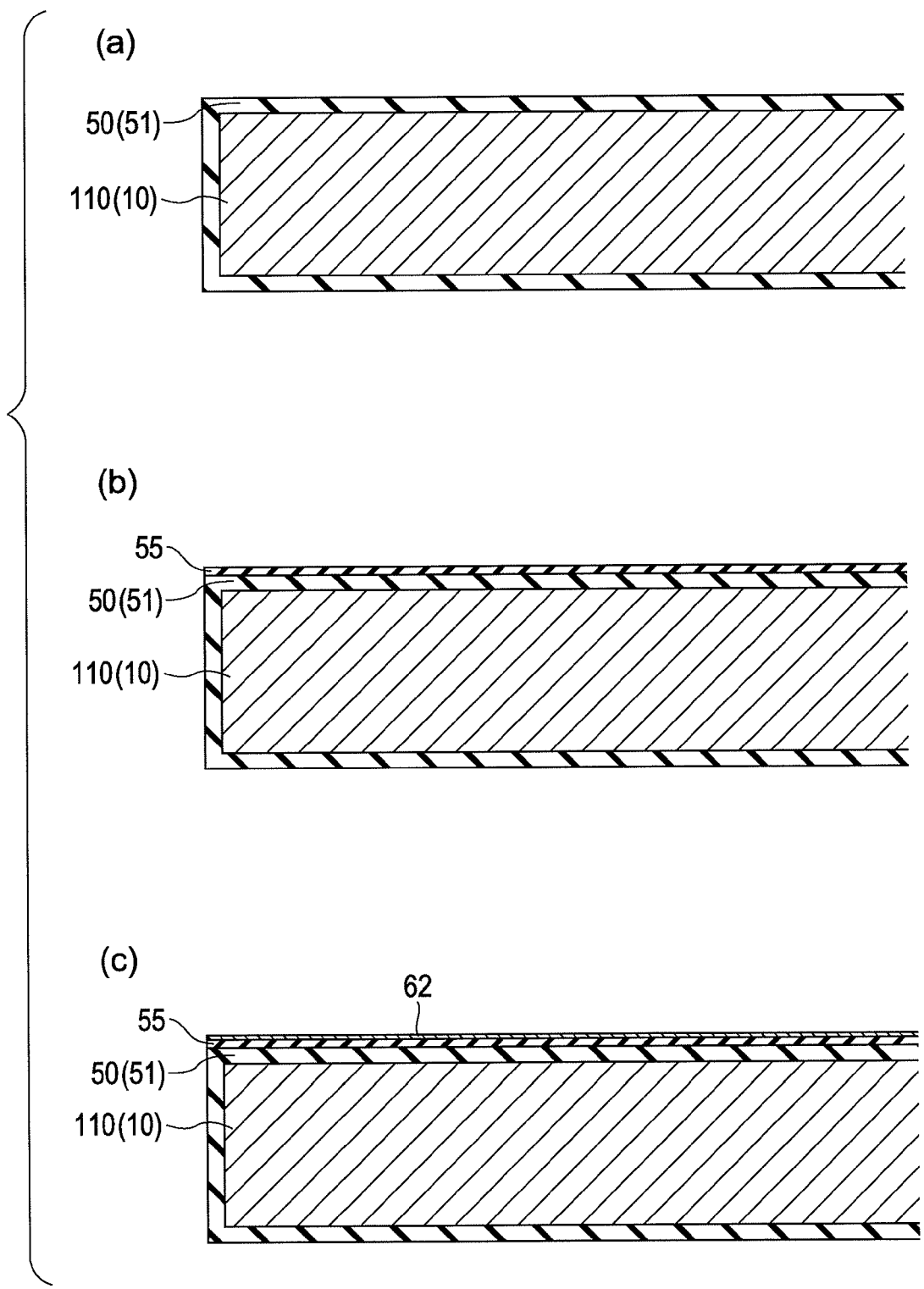
FIG. 3 is a sectional view illustrating a method of manufacturing the printing head according to the first embodiment.

First, as shown in (a) of FIG. 3, a silicon dioxide film 51 formed of silicon dioxide ($SiO_2$) and forming elastic film 50 is formed on the surface of the flow passage forming board wafer 110 which is formed integrally by the plurality of flow passage forming boards 10.

Subsequently, as shown in (b) of FIG. 3, the insulating film 55 formed of fluorite type oxide such as zirconium oxide ($ZrO_2$) is formed on the elastic film 50 (the silicon dioxide film 51). Of course, the insulating film 55 may be formed on the flow passage forming board wafer 110 without forming the silicon dioxide film 51.

Subsequently, a lower electrode metal layer 61 is formed. Specifically, first, as shown in (c) of FIG. 3, an adhering layer 62 is formed on the insulating film 55. Here, the adhering layer 62 is formed of at least one element as a major component selected from a group formed by titanium (Ti), chrome (Cr), tantalum (Ta), a zirconium (Zr), and tungsten (W), for example. In this embodiment, the adhering layer 62 formed of titanium (Ti) is formed. By forming the adhering layer 62, it is possible to improve an adhering property of the insulating film 55 and the lower electrode metal layer 61. Subsequently, as shown (a) of FIG. 8, an iridium layer 63 formed of iridium (Ir) and having a thickness of 2 nm, a platinum layer 64 formed of platinum (Pt) and having a thickness of 60 nm, and an iridium layer 65 formed of iridium (Ir) on the platinum layer 64 and having a thickness of 2 nm are laminated on the adhering layer 62. In this way, the lower electrode metal layer 61 is formed on the adhering layer 62, as shown in (a) of FIG. 4. In this embodiment, the lower electrode film 60 excellent in an electric property can be formed by allowing the lower electrode metal layer 61 to contain the platinum layer 64 and the iridium layers (63 and 65). In addition, the piezoelectric layer 70 controlling alignment can be formed by allowing the lower electrode metal layer 61 to contain the platinum layer 64. However, the lower electrode metal layer 61 may contain the iridium layer. For example, the metal layer may contain a layer formed by laminating the platinum layer and one iridium layer, only the iridium layer, or a layer formed of another conductive material instead of the platinum layer 64. Alternatively, the metal layer may be formed by laminating an additional layer formed of another conductive material in addition to the iridium layers and the platinum layer.

Figure 4:
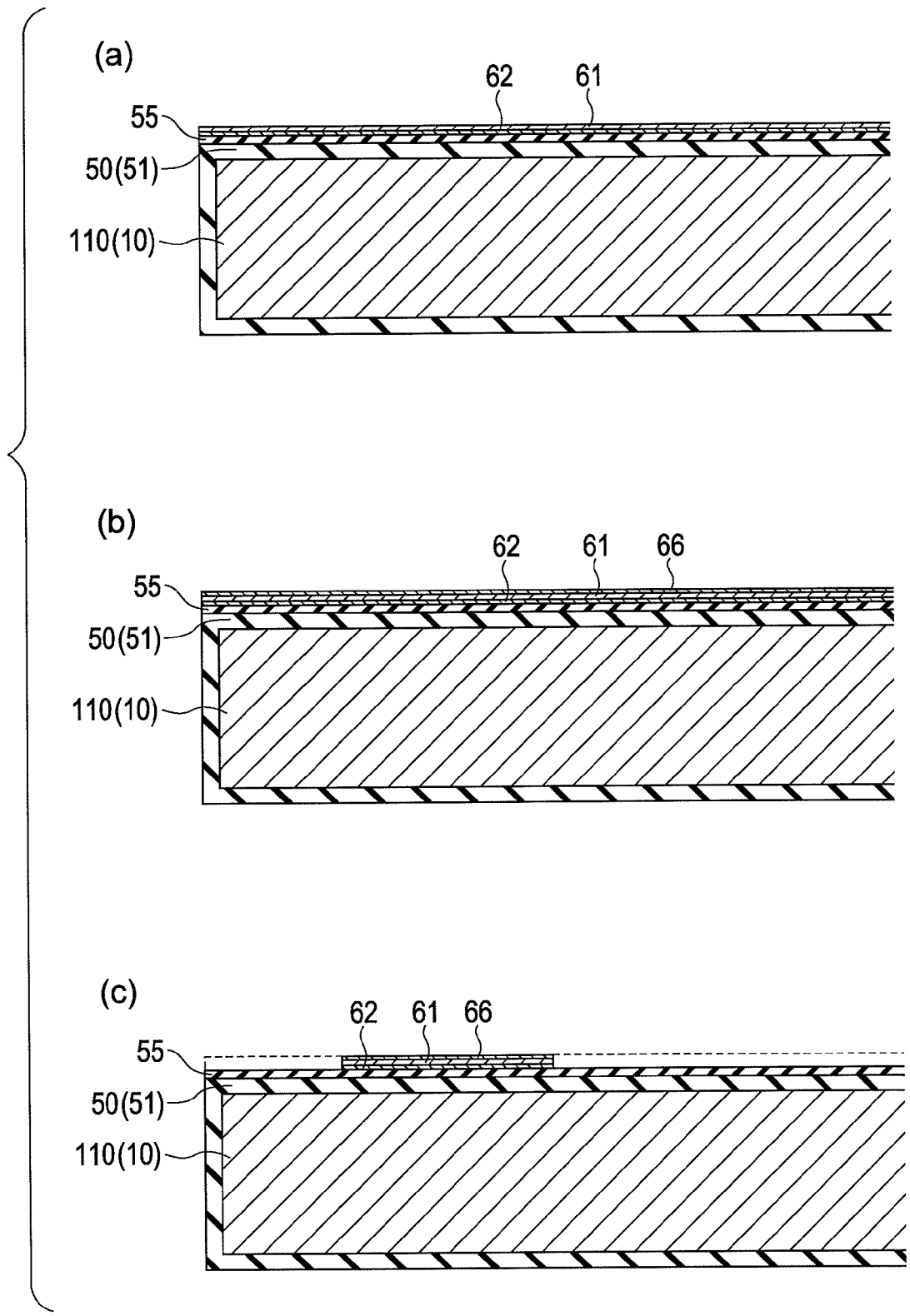
FIG. 4 is a sectional view illustrating a method of manufacturing the printing head according to the first embodiment.

Subsequently, as shown in (b) of FIG. 4, a seed titanium layer 66 formed of titanium (Ti) is formed on the lower electrode metal layer 61 by a DC magnetron sputtering method, for example. By forming the seed titanium layer 66 on the lower electrode metal layer 61, it is possible to control a priority alignment direction of the piezoelectric layer 70 to (100) or (111) upon forming the piezoelectric layer 70 on the lower electrode metal layer 61 through the seed titanium layer 66 in subsequent processes. Therefore, it is possible to obtain the piezoelectric layer 70 suitable for an electromechanical conversion element. The material of the seed titanium layer 66 is not limited to titanium (Ti). For example, a material such as titanium oxide or lead titanate containing at least titanium can be used. The seed titanium layer 66 is used to obtain good crystal by aid of crystallization of the piezoelectric layer 70 by forming an intermediate product such as lead titanate, when the piezoelectric layer 70 is formed by a baking process. However, a part or the whole of the piezoelectric layer 70 is diffused after the baking process.

As described above, the adhering layer 62, the layers 63 to 65 of the lower electrode metal layer 61, and the seed titanium layer 66 can be formed by a DC magnetron sputtering method, for example. It is preferable that the layers 63 to 65 of the lower electrode metal layer 61 and the seed titanium layer 66 are continuously formed in a vacuum state of a sputtering apparatuses. That is, by continuously forming the lower electrode metal layer 61 which are relatively easily peeled, it is possible to improve adhesiveness between the layers. Subsequently, after the adhering layer 62, the layers 63 to 65 of the lower electrode metal layer 61, and the seed titanium layer 66 are laminated, the lower electrode metal layer 61 is patterned to be formed, as shown in (c) of FIG. 4.

Subsequently, the piezoelectric layer 70 formed of lead zirconate titanate (PZT) is formed. In this embodiment, the piezoelectric layer 70 is formed by use of a so-called sol-gel method of applying and drying a so-called sol obtained by dissolving and dispersing a metal organic substance with a solvent to make a gel and baking the gel at a high temperature to obtain the piezoelectric layer 70 made of metal oxide. The material of the piezoelectric layer 70 is not limited to lead zirconate titanate. For example, another piezoelectric material such as relaxor ferroelectric (for example, PMN-PT, PZN-PT, or PNN-PT) may be used. In addition, the method of the manufacturing the piezoelectric layer 70 is not limited to the sol-gel method, but an MOD (Metal-Organic Decomposition) method may be used.

Figure 5:
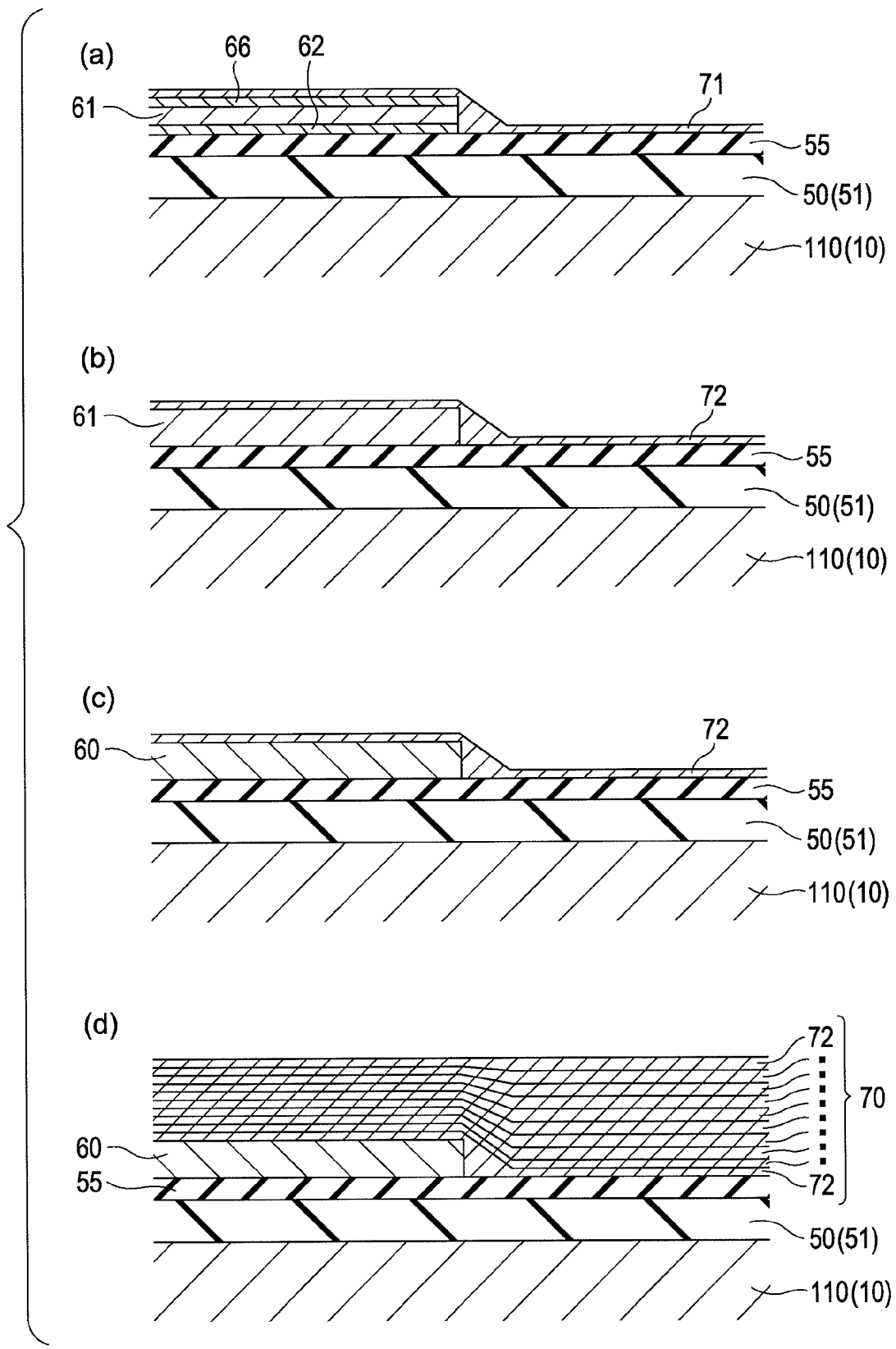
FIG. 5 is a sectional view illustrating a method of manufacturing the printing head according to the first embodiment.

As a specific sequence of forming the piezoelectric layer 70, as shown in (a) of FIG. 5, one layer, that is, the piezoelectric precursor film 71 as a piezoelectric precursor film is first formed on the lower electrode metal layer 61. That is, a sol (a solution) containing a metal organic compound is applied onto the flow passage forming board 10 in which the lower electrode metal layer 61 is formed (an applying process).

Subsequently, the piezoelectric precursor film 71 is heated at a predetermined temperature and dried for certain time (a drying process). In this embodiment, for example, the piezoelectric precursor film 71 is maintained at a temperature in the range from 170° C. to 180° C. for time in the range from 8 to 30 minutes.

Subsequently, the dried piezoelectric precursor film 71 is heated at a predetermined temperature and maintained for certain time to perform a fat-removing process (a fat-removing process). In this embodiment, for example, the piezoelectric precursor film 71 is heated at a temperature in the range from about 300° C. to 400° C. and maintained for time in the range from 10 minutes to 30 minutes to perform the fat-removing process. Here, the fat-removing process is a process of removing organic components contained in the piezoelectric precursor film 71 into $NO_2$, $CO_2$, $H_2O$, and the like, for example.

Subsequently, as shown in (b) of FIG. 5, the piezoelectric precursor film 71 is crystallized by heating the piezoelectric precursor film at a predetermined temperature and maintaining the predetermined temperature for certain time, and the piezoelectric film 72 is formed (a baking process). In the baking process, it is preferable that the piezoelectric precursor film 71 is heated at a temperature in the range from 680° C. to 900° C. In this embodiment, the piezoelectric precursor film 71 is baked by heating the piezoelectric precursor film at a temperature of 680° C. for time in the range from 5 minutes to 30 minutes to form the piezoelectric film 72. For example, a hot plate apparatus or an RTP (Rapid Thermal Processing) apparatus performing heating by emission of an infrared lamp can be used as a heating apparatus used in the drying process, the fat-removing process, and the baking process.

Hereinafter, the lower electrode metal layer 61 will be described in detail. When a first piezoelectric film 72 is formed by the baking process in a state where the lower electrode metal layer 61 is formed by laminating the iridium layer 63, the platinum player 64, and the iridium layer 65 on the adhering layer 62, as shown in (a) of FIG. 8, lead (Pb) and oxygen (O) of the piezoelectric film 72 is diffused to the lower electrode metal layer 61, as shown in (b) of FIG. 8. In this way, a part of the iridium layer 65 is oxidized to form an iridium oxide layer 65a in the piezoelectric film 72 and the adhering layer 62 is diffused to the insulating film 55 and the lower electrode metal layer 61.

Subsequently, as shown in (c) of FIG. 5, the iridium contained in the lower electrode metal layer 61 is oxidized to form the lower electrode film 60 after the process of forming the first piezoelectric film 72. Specifically, the iridium contained in the lower electrode metal layer 61 is oxidized by performing heating at a temperature in the range from 400° C. to 650° C. for 30 minutes or more to form the lower electrode film 60. In other words, a film formed by allowing substantially all iridium contained in the lower electrode metal layer 61 to turn into iridium oxide is the lower electrode film 60. Here, the "substantially all" means a state where a ratio of iridium oxide to the sum of the iridium oxide and the iridium present in the lower electrode 60 is 95% or more obtained by performing a generally known analysis method. Heating time is different depending on a heating temperature. For example, the heating time is about 3 hours at 400° C. or about 30 minutes at 650° C. In this embodiment, the heating time is about 3 hours at 400° C. Even through the baking process on the above-described piezoelectric precursor film 71 is performed plural times at the time of laminating the piezoelectric films 72, some iridium contained in the lower electrode metal layer 61 is just oxidized. Therefore, the iridium and the iridium oxide exist together. However, by performing the heating under the above-described condition for a long time, it is possible to oxidize all the iridium contained in the lower electrode metal layer 61. By performing the heating at a temperature lower than the temperature of the process of baking the piezoelectric precursor films 71, it is possible to completely oxidize the iridium contained in the lower electrode metal layer 61 without changing the state of the piezoelectric film 72. In this way, stress does not occur in an interface between the iridium and the iridium oxide and stress can be prevented from occurring inside the lower electrode film 60 or an interface between the lower electrode film 60 and the piezoelectric layer 70. Accordingly, crack can be prevented from occurring in the lower electrode film 60 or the piezoelectric layer 70. In addition, when the above-described heating is performed immediately after the formation of the lower electrode metal layer 61, the iridium may cohere at the time of oxidization. Therefore, a good lower electrode film cannot be obtained.

In this embodiment, the iridium layer 63 and the iridium layer 65 of the lower electrode metal layer 61 are each formed to have the thickness of 2 nm. However, it is preferable that the total thickness of the iridium layers of the lower electrode metal layer 61 is in the range from 2 to 5 nm. Even though described in detail, by configuring the total thickness of the iridium layers so as to have the above range, the iridium layer is expanded only in the thickness direction without expansion in an in-plane transverse direction when the iridium is oxidized. That is, the iridium is expanded when iridium turns into iridium oxide. However, when the total thickness of the iridium layers is in the range from 2 to 5 nm, the iridium is not expanded in the in-plane transverse direction but expanded only the thickness direction. For this reason, stress does not occur in an interface between the iridium oxide and another material. Moreover, by configuring the total thickness of the iridium layers to have the above range, all the iridium contained in the lower electrode metal layer 61 can be oxidized by the above-described heating.

In this embodiment, since the iridium layer 63 and the iridium layer 65 before the heating each have the thickness of 2 nm, the iridium layers are expanded by about 2.4 times only in the thickness direction at the time of heat oxidization. In this way, the stress can be prevented from occurring inside the lower electrode film 60 or in the interface between the lower electrode film 60 and the piezoelectric layer 70. Accordingly, the crack can be prevented from occurring in the lower electrode film 60 or the piezoelectric layer 70.

Like this embodiment, by forming the lower electrode film 60 after the formation of the first piezoelectric film 72 and before the formation of a second piezoelectric film 72, it is possible to prevent lead or oxygen from diffusing to the flow passage forming board wafer 110 due to iridium oxide, even when the lead or the oxygen flows out from the piezoelectric film 72. Moreover, since the oxygen of the piezoelectric film 72 can be prevented from leaking, it is possible to prevent characteristics of the piezoelectric film 72 from deteriorating. In this way, the piezoelectric element improved in durability can be manufactured.

By performing the piezoelectric film forming process including the applying process, the drying process, the fat-removing process, and the baking process described above plural times, in this embodiment, ten times, the piezoelectric layer 70 formed by ten piezoelectric films 72 and having the predetermined thickness is formed, as shown in (d) of FIG. 5. For example, when the thickness per one sol is about 0.1 μm, the entire thickness of the piezoelectric layer 70 is about 1.1 μm.

Figure 6:
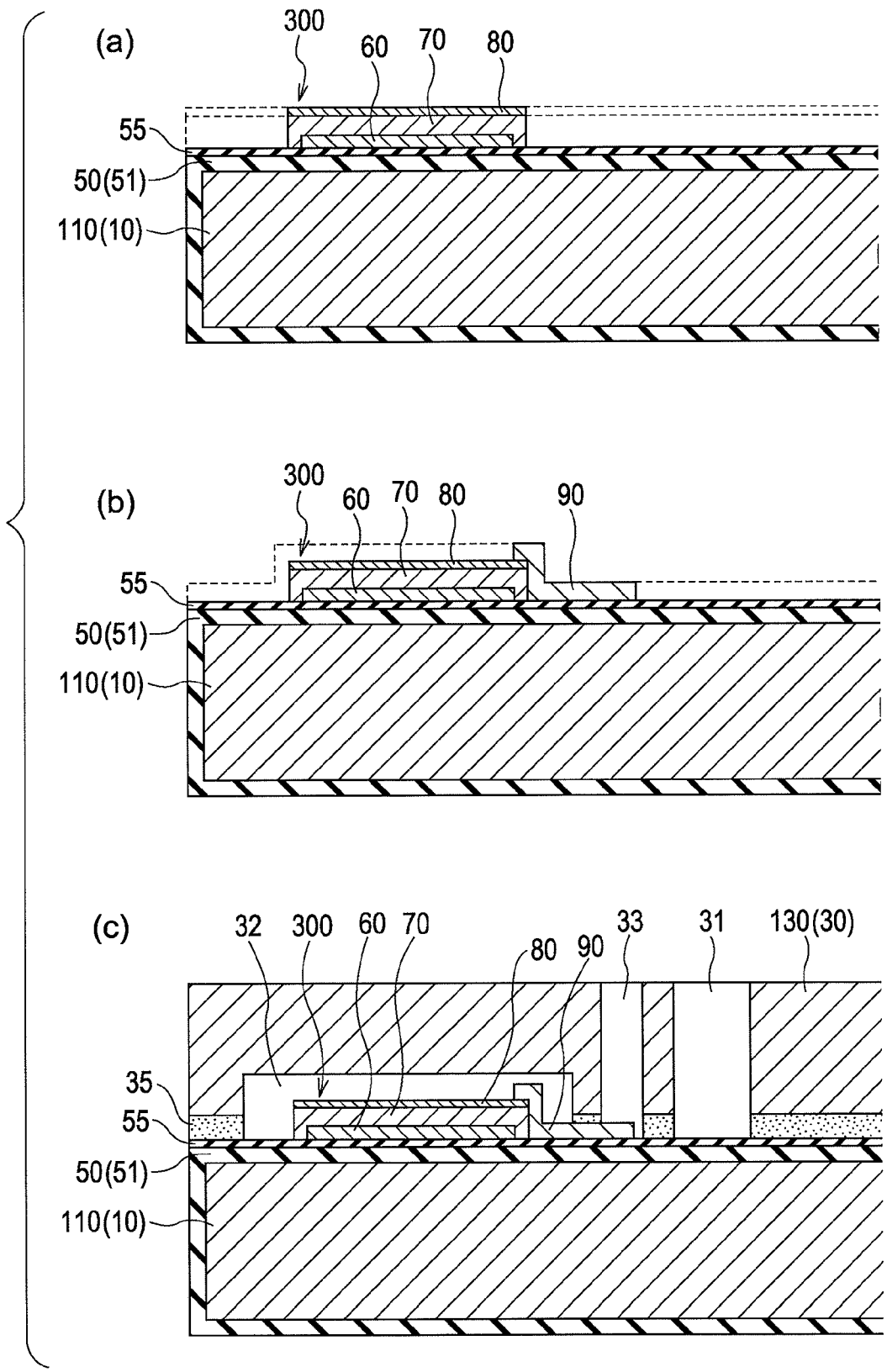
FIG. 6 is a sectional view illustrating a method of manufacturing the printing head according to the first embodiment.

After the piezoelectric layer 70 and the lower electrode film 60 are formed by the processes shown in (a) of FIG. 5 to (d) of FIG. 5, as shown in (a) of FIG. 6, the upper electrode film 80 formed of iridium (Ir), for example, is formed on the entire surface of the flow passage forming board wafer 110 and the piezoelectric layer 70 and the upper electrode film 80 are patterned in an area opposed to each of the pressure generating chambers 12 to form the piezoelectric element 300.

Subsequently, as shown in (b) of FIG. 6, each of the lead electrodes 90 is formed. Specifically, after the lead electrodes 90 formed of gold (Au), for example, are formed on the entire surface of the flow passage forming board wafer 110, each of the lead electrodes 90 is patterned in each of the piezoelectric elements 300 through a mask pattern (not shown) formed of a resist, for example.

Subsequently, as shown in (c) of FIG. 6, a protective board wafer 130 which is a silicon wafer and to be separated into a plurality of protective boards 30 is joined to a side of the piezoelectric elements 300 of the flow passage forming board wafer 110 by the adhesive 35. The reservoir section 31, the piezoelectric element preserver 32, and the like are formed in advance in the protective board 30. In addition, the protective board 30 is formed of a silicon single crystal substrate having a thickness of about 400 μm, for example. By joining the protective board 30, rigidity of the flow passage forming board 10 is considerably improved.

Figure 7:
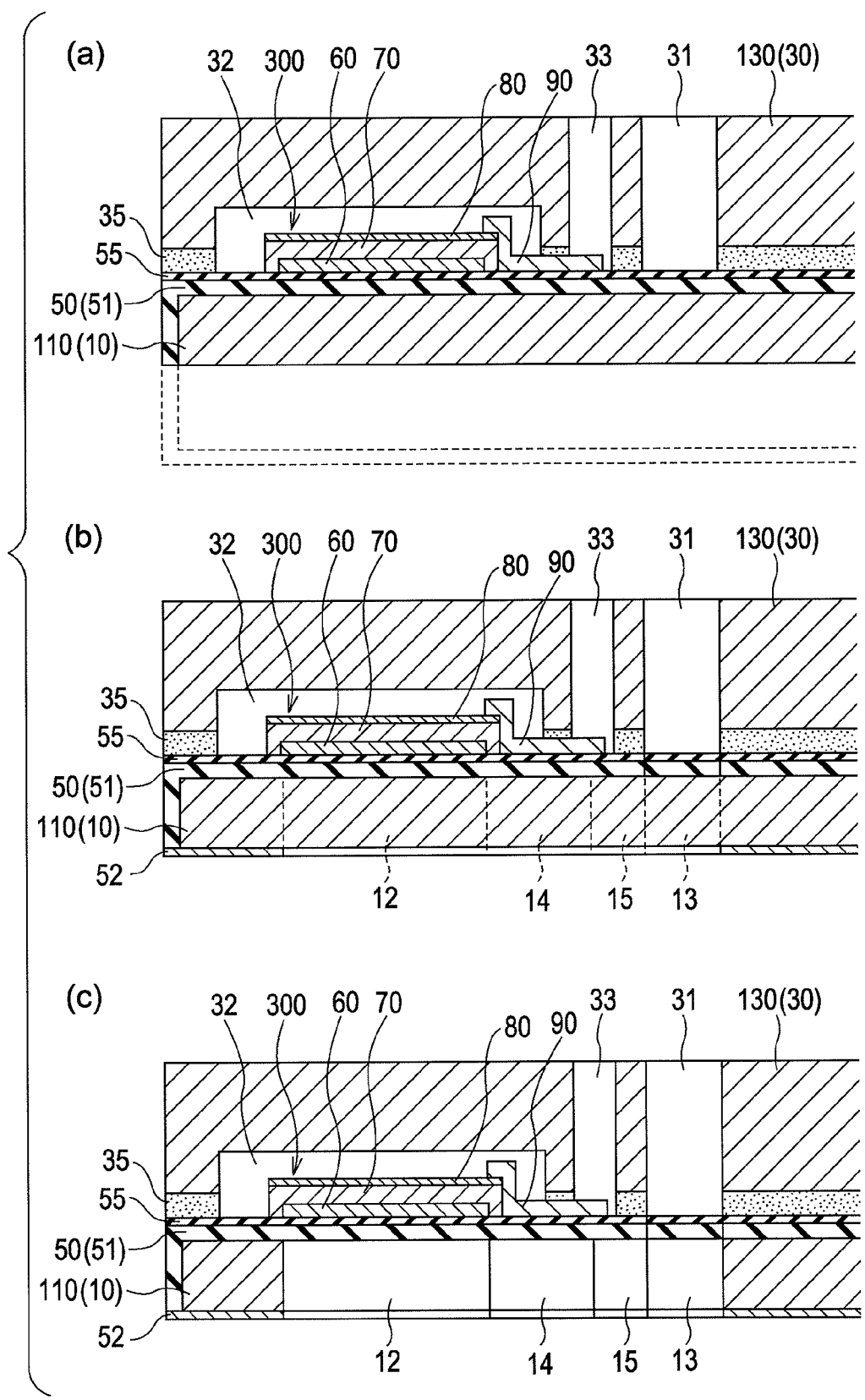
FIG. 7 is a sectional view illustrating a method of manufacturing the printing head according to the first embodiment.
Figure 8:
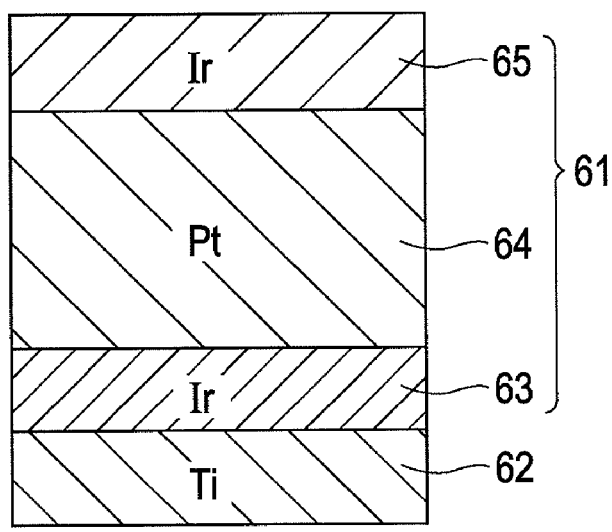
FIG. 8 is a sectional view illustrating major portions of a metal layer for a lower electrode in the manufacturing method according to the first embodiment.
Figure 8:
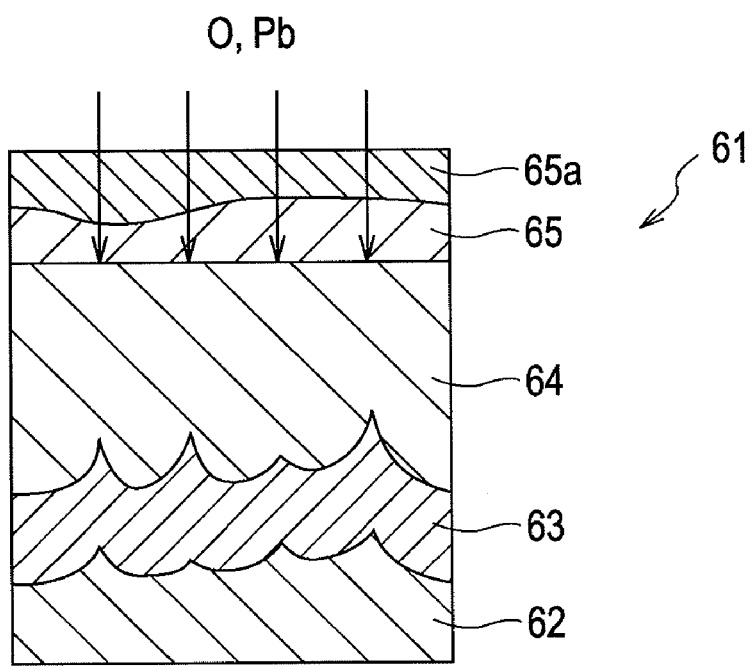

As shown in (a) of FIG. 7, the flow passage forming board wafer 110 is ground until the flow passage forming board wafer has a certain thickness. Thereafter, by performing wet etching by nitric acid, the flow passage forming board wafer 110 is formed so as to have a predetermined thickness. Subsequently, as shown in (b) of FIG. 7, a protective film 52 is formed on a surface of the flow passage forming board wafer 110 opposed to the surface provided with the piezoelectric elements 300 by patterning a silicon dioxide film 51 in a predetermined shape. Subsequently, as shown in (c) of FIG. 7, the pressure generating chambers 12, the communication section 13, the ink supply passages 14, and the communication passages 15 are formed by performing anisotropic etching (wet etching) by use of an alkali solution such as KOH on the flow passage forming board wafer 110 using the protective film 52 as a mask.

Subsequently, the nozzle plate 20 having the nozzle openings 21 perforated therethrough is joined onto the surface of the flow passage forming board 10 opposed to the protective board 30. By joining the compliance board 40 to the protective board 30, the ink jet printing head shown in FIG. 1 is formed.

Actually, several chips are simultaneously formed on one wafer by the series of film formation processes and the anisotropic etching described above. After the processing ends, the ink jet printing heads are formed by dividing the wafer into the flow passage forming boards 10 having one chip size shown in FIG. 1.

EXAMPLE

An iridium layer formed of iridium and having a thickness of 5 nm was formed on the silicon single crystal board by sputtering and then heated at 400° C. for 3 hours to form the iridium oxide layer.

Comparative Example

The iridium oxide layer was formed in the same way as that of Example, except that the thickness of the iridium layer is 10 nm.

Experimental Example

The cross-sections of the iridium oxide layers according to Example and Comparative Example were inspected by a TEM apparatus to measure the thickness of each iridium oxide. In addition, theoretical volume expansion is 2.4 times when iridium is oxidized to turn into iridium oxide.

TABLE 1

| | THICKNESS OF IR LAYER (nm) | THICKNESS OF $IRO_2$ LAYER (nm) | EXPANSION IN THICKNESS DIRECTION (MULTIPLE) |
|---|---|---|---|
| EXAMPLE | 5 | 12 | 2.4 |
| COMPARATIVE EXAMPLE | 10 | 17 | 1.7 |

As shown in Table 1, the thickness of the iridium layer formed by oxidizing the iridium layer having the thickness of 5 nm according to Example was expanded by 2.4 times in the thickness direction, and thus this expansion was equal to theoretical volume expansion. That is, it was known that the iridium layer was expanded only in the thickness direction.

However, the thickness of the iridium layer formed by oxidizing the iridium layer having the thickness of 10 nm according to Comparative Example was expanded by 1.7 times in the thickness direction, and thus this expansion was lower than the theoretical volume expansion. Therefore, it was known that the iridium layer was expanded also in the in-plane transverse direction.

As described above, by configuring the thickness of the iridium layer of the lower electrode metal layer to be 5 nm or less, the lower electrode metal layer is prevented from being expanded in the in-plane transverse direction and thus can be expanded only in the thickness direction. Accordingly, the stress can be prevented from occurring inside the lower electrode film 60 or in the interface between the lower electrode film 60 and the piezoelectric layer 70.

Other Embodiments

The manufacturing method according to the first embodiment of the invention has been described, but the method of manufacturing the ink jet printing head is not limited to the above-described method. For example, the process of forming the lower electrode film 60 by the heating at the temperature in the range from 400° C. to 650° C. for 30 minutes or more and oxidizing the iridium contained in the lower electrode metal layer 61 to form the lower electrode film may be performed after the process of forming the first piezoelectric film, after the process of forming a second piezoelectric film, after the process of forming a third piezoelectric film, or after the process of forming the uppermost piezoelectric film. In this case, since the iridium oxide serves as preventing lead or oxygen from diffusing from the piezoelectric film 72, it is preferable that the lower electrode film 60 is formed before the process of forming the piezoelectric film 72.

In the above-described first embodiment, the piezoelectric film 72 is formed by baking the piezoelectric precursor film 71 after the applying process, the drying process, and the fat-removing process, but the invention is not limited thereto. For example, the piezoelectric film 72 may be formed by baking the piezoelectric precursor film 71 after the applying process, the drying process, and the fat-removing process are performed plural times, for example, twice.

In the above-described first embodiment, the piezoelectric layer 70 is formed after the lower electrode metal layer 61 is patterned. However, in terms of the configuration, after the lower electrode metal layer 61 is formed on the entire surface of the flow passage forming board wafer 110 without patterning the lower electrode metal layer, the first piezoelectric film 72 may be formed, and then the lower electrode metal layer 61 (or the lower electrode film 60) may be patterned.

In the above-described first embodiment, the sol-gel or the MOD method is used as the method of forming the piezoelectric precursor film. However, the method of forming the piezoelectric precursor film is not limited to the above methods. For example, the piezoelectric precursor film may be formed by a sputtering method. Likewise, when the piezoelectric precursor film is formed by the sputtering method, the piezoelectric precursor film is heated at the temperature in the range from 400 to 650° C. for 30 minutes or more at the time of forming the piezoelectric layer 70 in the process of forming the plurality of piezoelectric films, after the formation of the first piezoelectric film.

Figure 9:
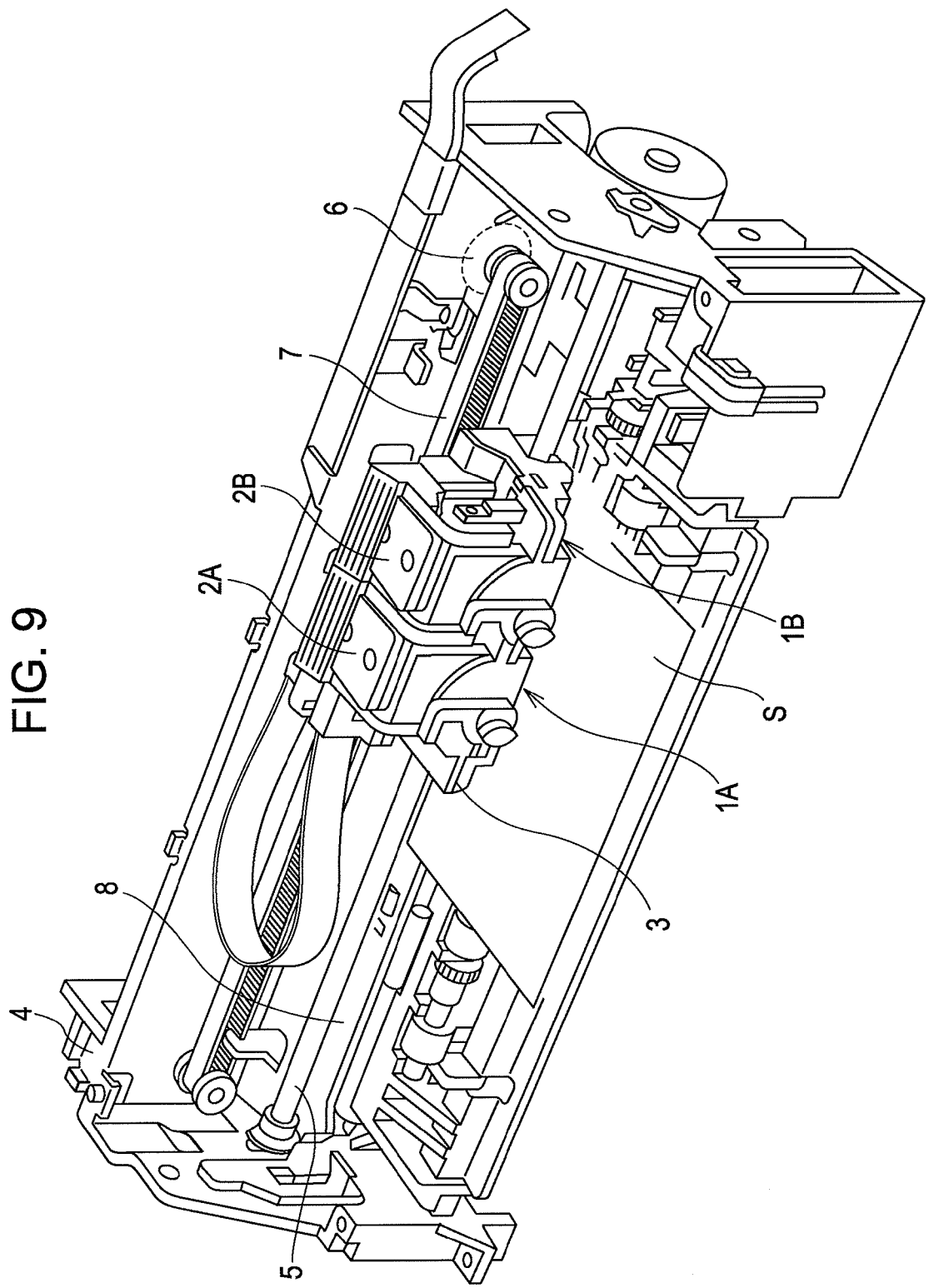
FIG. 9 is a schematic view illustrating a general configuration of a printing apparatus according to an embodiment.

The ink jet printing head according to the above-described embodiments forms a part of a printing head unit having an ink passage communicating with an ink cartridge and the like and is mounted on an ink jet printing apparatus. FIG. 9 is a schematic diagram illustrating an example of the ink jet printing apparatus.

As shown in FIG. 9, printing head units 1A and 1B each including an ink jet printing head are provided such that cartridges 2A and 2B forming ink supply means are detachably mounted. A carriage 3 mounted with the printing head units 1A and 1B is provided to freely move along a carriage shaft 5 mounted on an apparatus main body 4 in a shaft direction. The printing head units 1A and 1B are each configured to eject black ink and color ink, for example.

The carriage 3 mounting the printing head units 1A and 1B is moved along the carriage shaft 5 by delivering a driving force of a driving motor 6 to the carriage 3 through a plurality of toothed-gears (not shown) and a timing belt 7. On the other hand, a platen 8 is formed along the carriage shaft 5 in the apparatus main body 4. In addition, a printing sheet S as a printing medium such as a paper sheet fed by a sheet feeding roller or the like (not shown) is configured so as to be transported on the platen 8.

The above-described embodiment is applicable to a liquid jet apparatus which includes means for transporting an ejecting medium in a transport direction of the ejecting medium and is not operated when a head ejecting liquid droplets onto the ejection medium performs ejecting.

In the above-described first embodiment, the ink jet printing head has been described as an example of the liquid jet head of the invention, respectively. The invention is applicable broadly to various liquid jet heads. Of course, the invention is applicable to a liquid jet head ejecting a liquid other than ink. Examples of the liquid jet head include various printing heads used for an image printing apparatus such as a printer, a color material jet head used to manufacture a color filter such as a liquid crystal display, an electrode material jet head used to form electrodes such as an organic EL display or an FED (Field Emission Display), and a bio organism jet head used to manufacture a bio chip.

The invention claimed is:

1. A liquid jet head manufacturing method comprising:
    preparing a first board which is provided with pressure generating chambers individually communicating with nozzle openings for ejecting a liquid; and
    forming a piezoelectric element which includes a first electrode film formed on an area opposed to each of the pressure generating chambers of the first board, a piezoelectric layer, and a second electrode film formed on a surface of the piezoelectric layer opposite to the first electrode,
    wherein the step of forming the piezoelectric element includes forming a first electrode metal layer containing iridium on the first board, forming the piezoelectric layer having a plurality of piezoelectric films by performing a step of forming a piezoelectric precursor film on the first electrode metal layer and subjecting the piezoelectric precursor film to heat treatment to form the piezoelectric film plural times, and forming the second electrode film on the piezoelectric layer, and
    wherein the step of forming the first electrode metal layer includes forming the first electrode metal layer so as to contain one or more iridium layer and permit the iridium layer to have the total thickness in the range from 2 to 5 nm and forming the first electrode film by performing heating at a temperature in the range from 400 to 650° C. for 30 minutes or more after a first piezoelectric film is formed in the step of forming the piezoelectric layer to oxidize the iridium contained in the first electrode metal layer.

2. The method according to claim 1, wherein the step of forming the first electrode film by oxidizing the iridium is performed after the step of forming the first piezoelectric film and before the step of forming a second piezoelectric film.

3. A method of manufacturing a piezoelectric element including a first electrode film, a piezoelectric layer, and a second electrode film formed on a surface of the piezoelectric layer opposite to the first electrode, the method comprising:
    forming a first electrode metal layer containing iridium on a board;
    forming the piezoelectric layer having a plurality of piezoelectric films by performing a step of forming a piezoelectric precursor film on the first electrode metal layer and subjecting the piezoelectric precursor film to heat treatment to form the piezoelectric film plural times; and
    forming the second electrode film on the piezoelectric layer,
    wherein the step of forming the first electrode metal layer includes forming the first electrode metal layer so as to contain one or more iridium layer and permit the iridium layer to have the total thickness in the range from 2 to 5 nm and forming the first electrode film by performing heating at a temperature in the range from 400 to 650° C. for 30 minutes or more after a first piezoelectric film is formed in the step of forming the piezoelectric layer to oxidize the iridium contained in the first electrode metal layer.

4. A liquid jet apparatus comprising a liquid jet head manufactured by the method according to claim 1.

* * * * *